(12) United States Patent
Kim et al.

(10) Patent No.: US 7,538,017 B2
(45) Date of Patent: May 26, 2009

(54) METHOD OF MANUFACTURING A THIN FILM TRANSISTOR, A THIN FILM TRANSISTOR MANUFACTURED BY THE METHOD, A METHOD OF MANUFACTURING FLAT PANEL DISPLAY DEVICE, AND A FLAT PANEL DISPLAY DEVICE MANUFACTURED BY THE METHOD

(75) Inventors: Min-Kyu Kim, Suwon-si (KR); Jae-Bon Koo, Suwon-si (KR); Yeon-Gon Mo, Suwon-si (KR); Hyun-Soo Shin, Suwon-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 452 days.

(21) Appl. No.: 11/263,058

(22) Filed: Oct. 31, 2005

(65) Prior Publication Data
US 2006/0094166 A1 May 4, 2006

(30) Foreign Application Priority Data
Nov. 3, 2004 (KR) ................ 10-2004-0088878

(51) Int. Cl.
*H01L 21/3205* (2006.01)
(52) U.S. Cl. ................ 438/586; 438/669; 257/E21.176
(58) Field of Classification Search ................ 438/586, 438/652, 666, 674, 669
See application file for complete search history.

(56) References Cited

U.S. PATENT DOCUMENTS 6,538,390 B2 * 3/2003 Fujita et al. ............. 315/169.3
6,911,666 B2 * 6/2005 Voutsas ....................... 257/40

* cited by examiner

*Primary Examiner*—W. David Coleman
(74) *Attorney, Agent, or Firm*—Knobbe Martens Olson & Bear, LLP

(57) ABSTRACT

Provided are a method of manufacturing a plastic substrate having a TFT, a substrate manufactured thereby, a method of manufacturing a flat panel display device, and a flat display device manufactured thereby, which can be used for a flexible flat display device. The method includes: preparing a film in which a plurality of conductive patterns are included; bonding the film to a substrate; forming the TFT in a manner such that it is electrically connected to the conductive pattern on the film; and forming an insulating layer covering the TFT on the film.

27 Claims, 5 Drawing Sheets

METHOD OF MANUFACTURING A THIN FILM TRANSISTOR, A THIN FILM TRANSISTOR MANUFACTURED BY THE METHOD, A METHOD OF MANUFACTURING FLAT PANEL DISPLAY DEVICE, AND A FLAT PANEL DISPLAY DEVICE MANUFACTURED BY THE METHOD

CROSS-REFERENCE TO RELATED APPLICATION

This application claims the benefit of Korean Patent Application No.10-2004-0088878, filed on Nov. 3, 2004, in the Korean Intellectual Property Office, the disclosure of which is incorporated herein in its entirety by reference.

BACKGROUND OF THE INVENTION

1. Field of the Invention

The present embodiments relate to a method of manufacturing a substrate having a thin film transistor (TFT), a TFT manufactured according to the same, a method of manufacturing a flat panel display device, and a flat display device manufactured according to the same, and more particularly, to a method of manufacturing a substrate having a TFT that can be applied to flexible devices having a plastic substrate, a substrate having the TFT manufactured according to the same, a method of manufacturing a flat panel display device, and a flat display device manufactured according to the same.

2. Description of the Related Art

Thin film transistors (TFTs) used in a flat panel display device, such as liquid crystal display (LCD) devices, organic light emitting display (OLED) devices, or inorganic light emitting display devices, are used as a switching device that controls the operation of each pixel, and as a driving device for driving each pixel.

The TFT includes a semiconductor layer, a gate electrode, and source and drain electrodes. The semiconductor layer includes source and drain regions doped at high concentration and a channel region formed between the source and drain regions. The gate electrode is insulated from the semiconductor layer and located in a region corresponding to the channel region. The source and drain electrodes are respectively connected to source and drain regions.

Recently, flat display devices have been required to have the characteristics of slimness and flexibility.

In order to obtain flexibility of a flat display device, attempts have been made using a plastic substrate instead of the conventional glass substrate.

However, in the case of the plastic substrate, an additional barrier layer must be formed, since the plastic substrate is less waterproof and less resistant to oxygen penetration than the glass substrate. The barrier layer is coated on the surface of the plastic substrate to block the penetration of oxygen or moisture through the substrate. The barrier layer is expensive and requires an additional process.

To obtain a flexible flat display device, an organic semiconductor thin film transistor is used instead of a conventional silicon thin film transistor. When the organic semiconductor is used, an inexpensive thin film transistor can be manufactured, since the organic semiconductor can be formed at a low temperature, and can easily be applied to the plastic substrate, which cannot be used at a high temperature.

However, when a TFT is manufactured using the organic semiconductor, and a light emitting device is subsequently formed by a conventional process, the organic semiconductor is easily deformed. Particularly, in the case of the OLED device, forming a pixel electrode connected to the TFT and forming an aperture for a light emitting device on a pixel defining film may both cause problems.

Therefore, to manufacture a flexible flat display device, a new method is needed.

SUMMARY OF THE INVENTION

The present embodiments can be applied to a flexible device, and provide a method of manufacturing a substrate having a thin film transistor (TFT) included on a plastic substrate, a substrate manufactured thereby, a method of manufacturing a flat panel display device, and a flat panel display device manufactured thereby.

According to an aspect of the present embodiments, there is provided a method of manufacturing a substrate having a thin film transistor (TFT), the method comprising: preparing a film in which a plurality of conductive patterns are included on a base; bonding the film to a substrate; forming the TFT in a manner such that it is electrically connected to the conductive pattern on the film; and forming an insulating layer covering the TFT on the film.

According to another aspect of the present embodiments, there is provided a substrate having a TFT manufactured according to the method described above.

According to still another aspect of the present embodiments, there is provided a method of manufacturing a flat panel display device, the method comprising: preparing a film in which a plurality of conductive patterns are included on a base; bonding the film to a substrate; forming the TFT in a manner such that it is electrically connected to the conductive pattern on the film; forming an insulating film covering the TFT on the film; forming an opening in the insulating film to expose a region of the conductive pattern; and forming a display device on the conductive pattern exposed through the opening.

According to one embodiment, there is provided a flat panel display device comprising: a film bonded to a substrate in which a plurality of conductive patterns are included on a base, a TFT that it is electrically connected to the conductive pattern on the film, an insulating film covering the TFT on the film, and an opening in the insulating film that exposes a region of the conductive pattern.

In one aspect, the TFT comprises: at least one of source and drain electrodes connected to the conductive pattern, wherein the source and drain electrodes are formed on the film, a semiconductor layer contacting each of the source and drain electrodes, a gate insulating film on the semiconductor layer and a gate electrode on the gate insulating film.

In another aspect, the gate insulating film is patterned to at least a region corresponding to the semiconductor layer. In yet another aspect, the semiconductor layer is formed of an organic material.

In still another aspect, the organic material comprises at least one from the group consisting of pentacene, tetracene, naphthalene, alpha-4-thiophene, alpha-6-thiophene, perylene and its derivatives, rubrene and its derivatives, coronene and its derivatives, perylene tetracarboxylic diimide and its derivatives, perylene tetracarboxylic dianhydride and its derivatives, oligonaphthalene and its derivatives, alpha-5-thiophene oligothiophene and its derivatives, phthalocyanine that does or does not include a metal and its derivatives, pyromelitic dianhydride and its derivatives, and pyromelitic diimide and its derivatives.

In another aspect, the TFT comprises: at least one source electrode and at least one drain electrode connected to the conductive pattern, wherein the source and drain electrodes are formed on the semiconductor layer, a gate insulating film on the semiconductor layer and the source and drain electrodes and a gate electrode on the gate insulating film.

In another aspect, the gate insulating film is patterned to at least a region corresponding to the semiconductor layer.

In another aspect, the semiconductor layer is formed of an organic material.

In another aspect, the organic material comprises at least one from the group consisting of pentacene, tetracene, naphthalene, alpha-4-thiophene, alpha-6-thiophene, perylene and its derivatives, rubrene and its derivatives, coronene and its derivatives, perylene tetracarboxylic diimide and its derivatives, perylene tetracarboxylic dianhydride and its derivatives, oligonaphthalene and its derivatives, alpha-5-thiophene oligothiophene and its derivatives, phthalocyanine that does or does not include a metal and its derivatives, pyromelitic dianhydride and its derivatives, and pyromelitic diimide and its derivatives.

In still another aspect, at least one of the surfaces of the film does not expose the conductive pattern, and wherein the surface of the film on which the conductive pattern is not exposed faces the outside.

In another aspect, the substrate comprises plastic.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described more fully with reference to the accompanying drawings, in which exemplary embodiments are shown.

Figure 6:
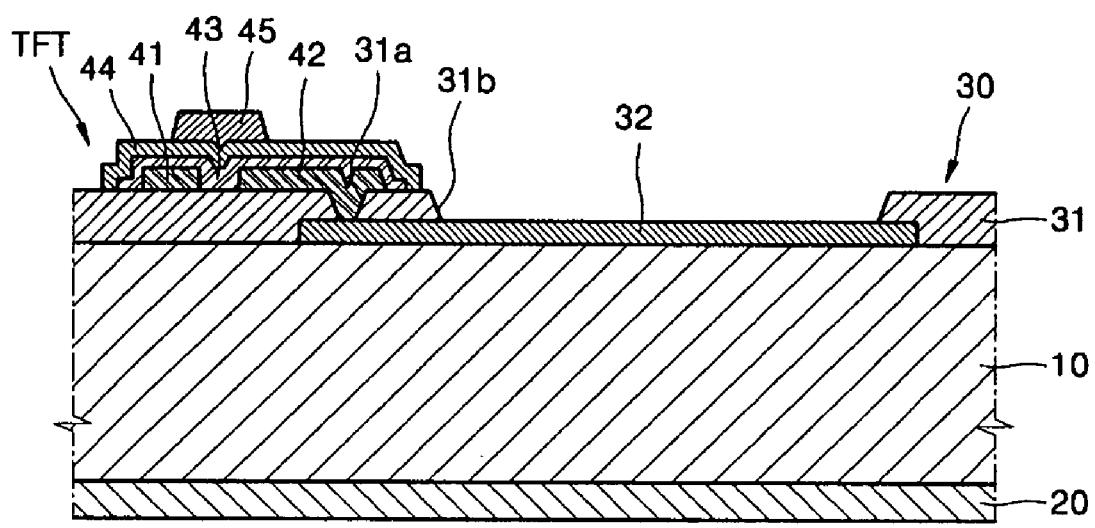
Figure 7:
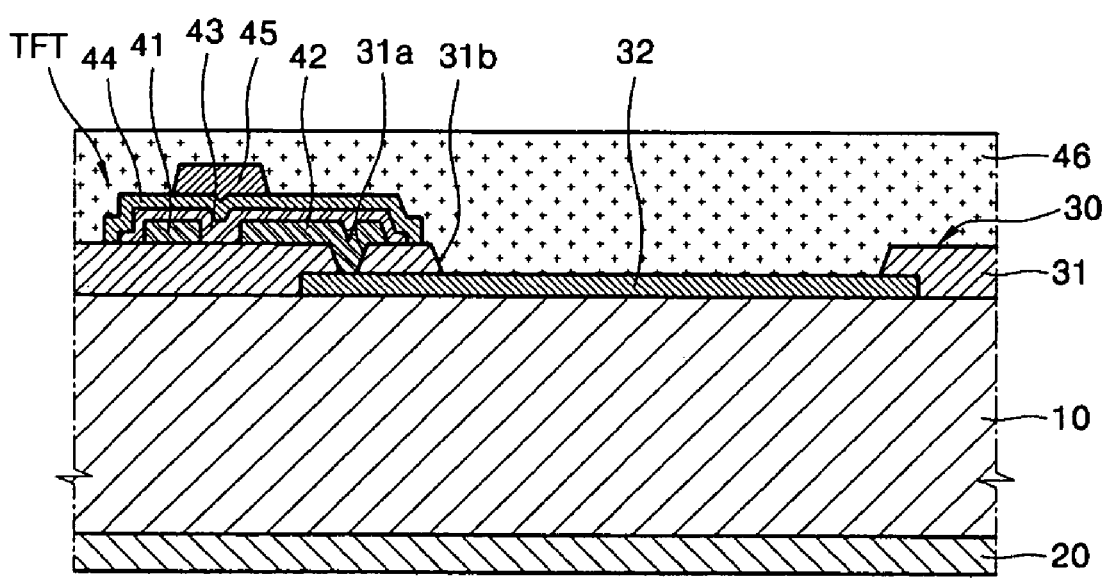
Figure 8:
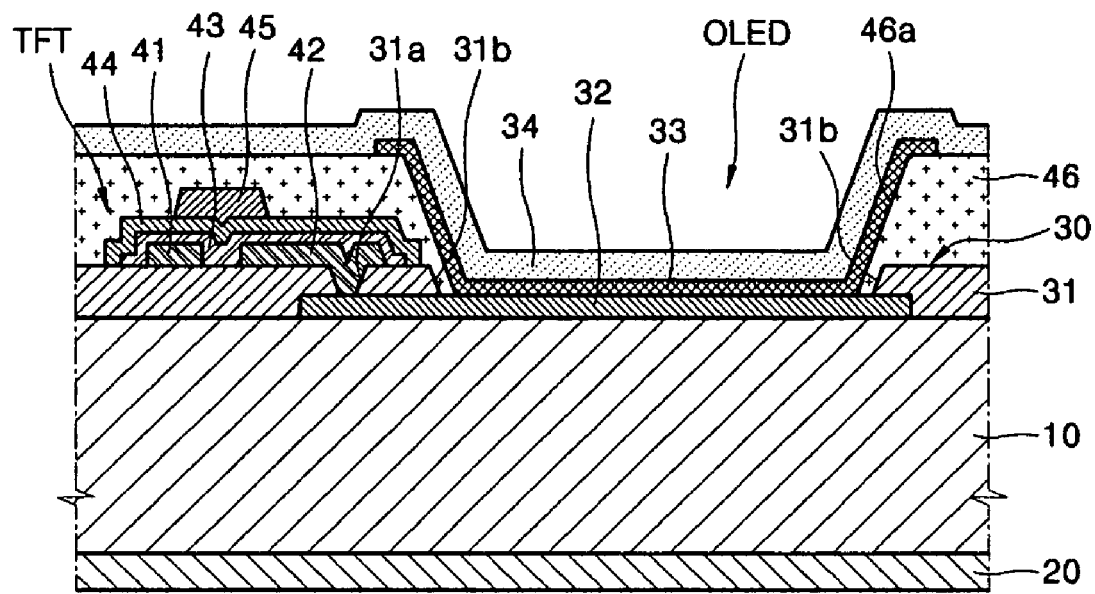
FIG. 8 is a cross-sectional view illustrating a method of manufacturing an organic light emitting display device using the substrate manufactured according to the method depicted in FIGS. 1 through 7.

FIGS. 1 through 7 are cross-sectional views illustrating the sequence of a method of manufacturing a substrate having a thin film transistor according to an embodiment, and FIG. 8 is a cross-sectional view illustrating a method of manufacturing an organic light emitting display device using the substrate manufactured according to the method illustrated in FIGS. 1 through 7.

Figure 1:
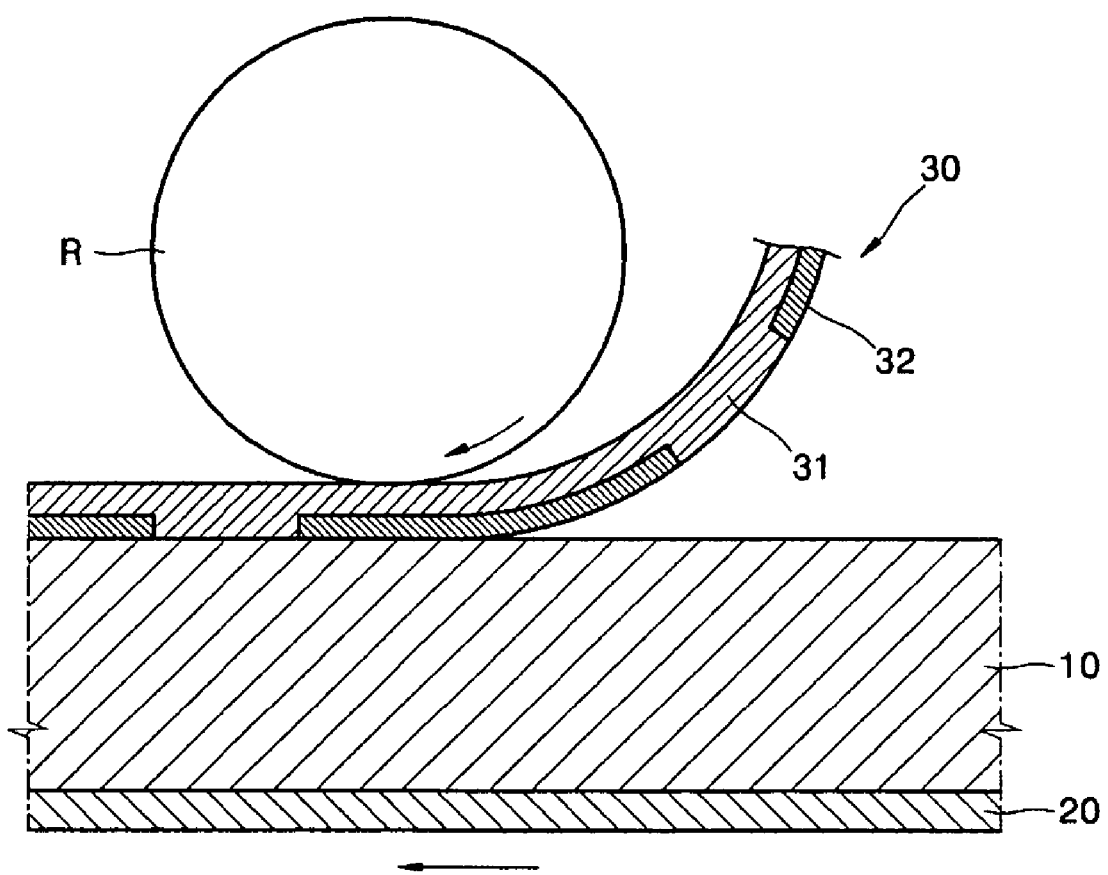
FIGS. 1 through 7 are cross-sectional views illustrating a method of manufacturing a thin film transistor on a plastic substrate according to one embodiment.
Figure 2:
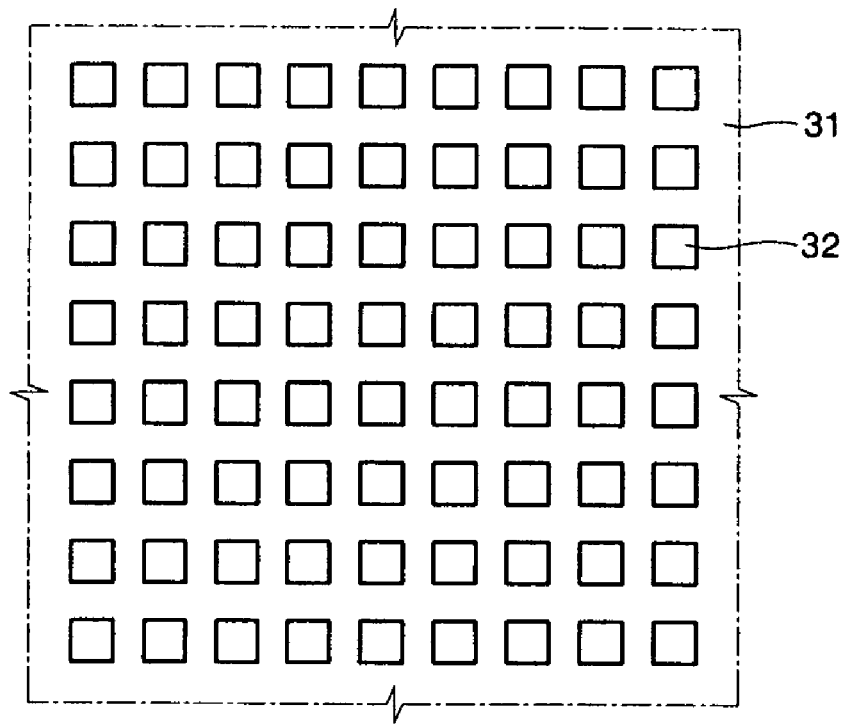

Referring to FIG. 1, a film 30 is lamination bonded using a lamination roller R on a substrate 10. The film 30 is made such that a conductive pattern 32 is included in a base 31 formed of a resin. Referring to FIG. 2, the conductive pattern 32 is formed in a regular pattern.

The conductive pattern 32 will become a pixel electrode and can be formed in a single layer or multiple layers of a conductive material, which will be described later.

The conductive pattern 32 can be formed of, for example, ITO, IZO, or ZnO when the pixel electrode is used as a transparent electrode, and can be formed of, for example, Ag, Mg, Al, Pt, Pd, Au, Ni, Nd, Ir, Cr, or a compound of these metals when the pixel electrode is used as a reflective electrode. When the pixel electrode is used as a transparent electrode, the pixel electrode is an anode electrode, and when the pixel electrode is used as a reflective electrode, the pixel electrode is a cathode electrode. However, the present embodiments are not limited thereto, and even if the pixel electrode is used as a reflective electrode, after forming a reflection film formed of, for example, Ag, Mg, Al, Pt, Pd, Au, Ni, Nd, Ir, Cr, or an alloy of these metals, an ITO film, an IZO film, a ZnO film, or an $In_2O_3$ film, etc. can be formed on the reflective film, and the pixel electrode can be an anode.

In at least one surface of the film 30, the conductive pattern 32 is not exposed to the outside. As depicted in FIG. 1, when the film 30 is laminated on the substrate 10, the lamination is performed so that the surface of the conductive pattern 32 which is not exposed faces the outside. In FIGS. 1 through 8, the conductive pattern 32 of the film 30 is shown with the side facing the substrate 10 exposed, but the present embodiments are not limited thereto, and the conductive pattern 32 might not be exposed on either side of the film 30.

The film 30 can be bonded in various ways. As depicted in FIG. 1, the film 30 can be laminated, or can be attached to the substrate 10 using an adhesive.

In one embodiment, the substrate 10 can be a plastic substrate. In this embodiment, a barrier layer 20 may be coated on the opposite surface to that which the film 30 is attached. The barrier layer 20 blocks the penetration of moisture and/or oxygen through the substrate 10. The barrier layer may be coated on the surface on which the film 30 is attached.

The barrier layer 20 can be, for example, a composite layer of an inorganic material layer and a polymer layer.

The inorganic material layer can be formed of, for example, metal oxides, metal nitrides, metal carbides, metal oxynitrides, or a compound of these metals. The metal oxides can be, for example, silica, alumina, titania, indium oxide, tin oxide, indium tin oxide, or a compound of these oxides. The metal nitride can be, for example, aluminum nitride, silicon nitride, or a compound of these nitrides. The metal carbide can be, for example, silicon carbide, and the metal oxynitride can be, for example, silicon oxynitride. The inorganic material layer can be formed of any inorganic material that can block the penetration of moisture or oxygen, such as silicon.

The inorganic material layer can be formed by deposition or other methods. When the inorganic material layer is formed by evaporation, pores can form in the inorganic material layer. In some embodiments, in order to prevent the pores from continuously growing on the same spot, a polymer layer can be further included in addition to the inorganic material layer. The polymer layer can be formed of, for example, organic polymer, inorganic polymer, organometallic polymer, or hybrid organic/inorganic polymer.

The barrier layer 20 is not necessarily included, and may be omitted.

The substrate 10 is not limited to plastic, but can also be formed of glass or metal.

Figure 3:
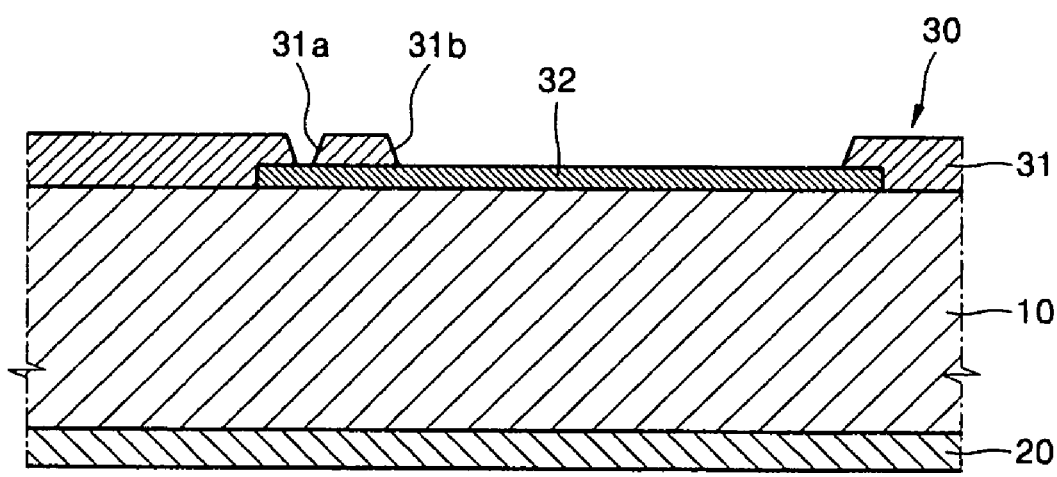

Referring to FIG. 3, a first opening 31a and a second opening 31b are formed by patterning the film 30 after the film 30 is attached to the substrate 10.

The first opening 31a, as will be described later, allows the drain electrode to contact the conductive pattern 32, and the second opening 31b, as will be described later, is to form a light emitting device.

Figure 4:
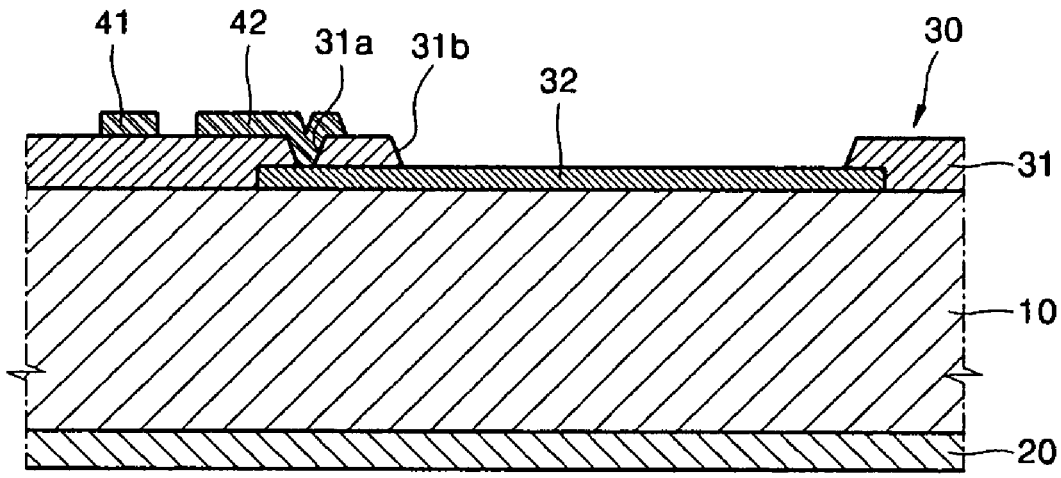

Referring to FIG. 4, a source electrode 41 and a drain electrode 42 are formed on the base 31 after patterning the film 30.

At this time, as described above, the drain electrode 42 is connected to the conductive pattern 32 through the first opening 31a.

Figure 5:
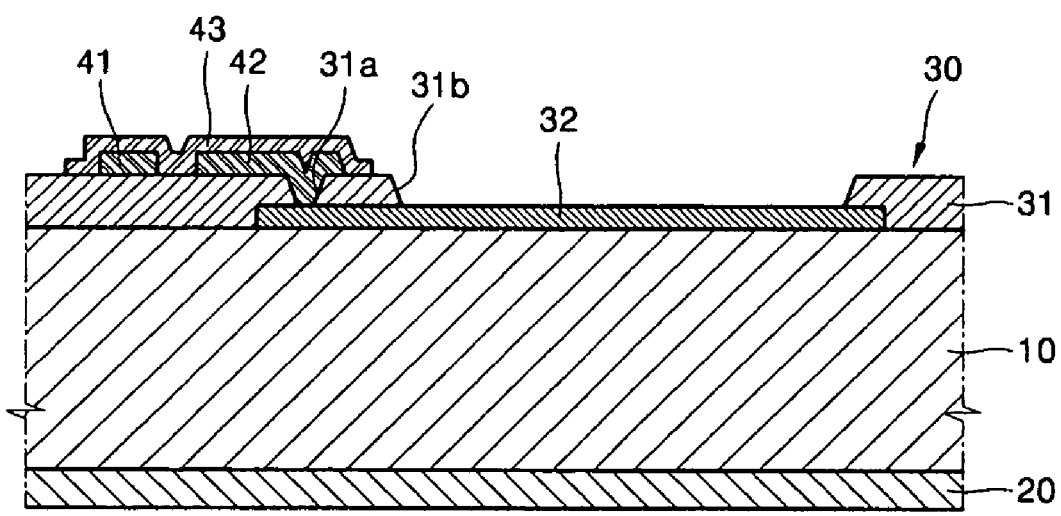

After the source and drain electrodes 41 and 42 are formed, as depicted in FIG. 5, a semiconductor layer 43 is formed covering the source and drain electrodes 41 and 42.

The semiconductor layer 43 can be, for example an organic semiconductor.

An organic semiconductor can be formed of a semiconductive organic material, such as a polymer or a low molecular weight organic compound. The semiconductive organic material includes at least one from the group consisting of pentacene, tetracene, naphthalene, alpha-4-thiophene, alpha-6-thiophene, perylene and its derivatives, rubrene and its derivatives, coronene and its derivatives, perylene tetracarboxylic diimide and its derivatives, perylene tetracarboxylic dianhydride and its derivatives, oligonaphthalene and its derivatives, alpha-5-thiophene oligothiophene and its derivatives, phthalocyanine that does or does not include a metal and its derivatives, pyromelitic dianhydride and its derivatives, and pyromelitic diimide and its derivatives.

At this time, referring to FIG. 5, after forming the organic semiconductor layer 43 covering the source and drain electrodes 41 and 42, the semiconductor layer 43 is patterned to have regions as depicted in FIG. 5, using a laser etching method, such as a laser ablation method. Besides this method, other patterning methods which are used for patterning organic semiconductors can also be applied, and the regions are not necessarily patterned as shown in FIG. 5.

The semiconductor layer 43 can be an inorganic semiconductor layer formed of, for example, CdS, GaS, ZnS, CdSe, CaSe, ZnSe, CdTe, SiC, or Si.

Referring to FIG. 6, after forming the semiconductor layer 43, a gate insulating film 44 is formed on the semiconductor layer 43, and a gate electrode 45 is formed on the gate insulating film 44.

The gate insulating film 44 can be formed of organic or inorganic materials. Examples of suitable inorganic material include $SiO_2$, $SiNx$, $Al_2O_3$, $TiO_2$, $Ta_2O_5$, $HfO_2$, $ZrO_2$, BST, and PZT, and examples of suitable organic material include general polymer, polymethyl methacrylate (PMMA), polystyrene (PS), polymer derivatives having a phenol group, acrylic polymer, imide polymer, aryl ether polymer, amide polymer, fluoride polymer, p- xylylene polymer, vinyl alcohol polymer, and a blend of these materials. Also, inorganic-organic stack layer films can be used.

The gate insulating film 44 can be patterned to an island type as depicted in FIG. 6 so that it receives less stress when the substrate 10 is bent. The gate insulating film 44 can be patterned at least to cover a region corresponding to the semiconductor layer 43.

However, the present embodiments are not limited thereto, and the gate insulating film 44 can be formed to cover any part of the entire region but the region on which the light emitting device is formed.

The gate electrode 45 is formed to correspond to the channel region of the semiconductor layer 43.

Referring to FIG. 7, after forming the gate electrode 45, an insulating film 46 can be further formed to cover the TFT. The insulating film 46 protects the TFT and, as will be described later, has openings which allow it to act as a pixel defining layer.

The insulating film 46 can be a single layer or multiple layers of inorganic or organic materials. Examples of suitable inorganic material includes $SiO_2$, $SiN_x$, $Al_2O_3$, $TiO_2$, $Ta_2O_5$, $HfO_2$, $ZrO_2$, BST, and PZT, and examples of the organic material includes general polymer, polymethyl methacrylate (PMMA), polystyrene (PS), polymer derivatives having phenol group, acrylic polymer, imide polymer, arylether polymer, amide polymer, fluoride polymer, p-xylylene polymer, vinyl alcohol polymer, and a blend of these materials. However, the present embodiments are not limited thereto, and various insulating materials can be used.

After forming the substrate 10 having the TFT formed by the method described above, referring to FIG. 8, a third opening 46a is formed to expose a portion of the conductive pattern 32 by etching the insulating film 46.

In the present embodiments, the second opening 31b described above can be formed at the same time as the third opening 46a.

An organic light emitting diode (OLED) is formed by forming an organic layer 33 that includes an emission layer (not shown) and a facing electrode 34 covering the organic layer 33 in the third opening 46a.

The organic layer 33 can be, for example, a low molecular weight organic layer or a polymer organic layer.

If the organic layer 33 is a low molecular weight organic layer, the organic layer 33 can be formed in a single or a composite structure by stacking a Hole Injection Layer (HIL), a Hole Transport Layer (HTL), an Emission Layer (EML), an Electron Transport Layer (ETL), and an Electron Injection Layer (EIL). Examples of organic materials that can be used for forming the organic layer 33 include copper phthalocyanine (CuPc), N,N'-di(naphthalene-1-yl)-N,N'-diphenyl-benzidine (NPB), and tris-8-hydroxyquinoline aluminum (Alq3). The low molecular weight organic layer can be formed by an evaporation method.

If the organic layer 33 is a polymer organic layer, the organic layer 33 can have a structure having a HTL and an EML. At this time, the polymer HTL is formed of poly-(2,4)-ethylene-dihydroxy thiophene (PEDOT) and the EML is formed of a polyphenylenevinylene (PPV) or polyfluorene group polymer organic material using an inkjet printing or spin coating method.

The facing electrode 34 can be used as a transparent electrode or a reflective electrode. When the facing electrode 34 is used as a transparent electrode, the facing electrode 34 can be formed of, for example, ITO, IZO, ZnO or $In_2O_3$, and when the facing electrode 34 is used as a reflection electrode, the facing electrode 34 can be formed of, for example, Li, Ca, LiF/Ca, LiF/Al, Al, Mg, or a compound of these metals. ITO, IZO, ZnO or $In_2O_3$ form on the reflection film after forming the reflection film using, for example, Ag, Mg, Al, Pt, Pd, Au, Ni, Nd, Ir, Cr, or a compound of these metals. However, the present embodiments are not limited thereto, and even if the facing electrode 34 is used as a transparent electrode, after depositing a material layer formed of a metal having a low work function, such as for example, Li, Ca, LiF/Ca, LiF/Al, Al, Ag, Mg, or a compound of these metals facing the organic layer 33, an auxiliary electrode layer or a bus electrode line formed of a material for forming the transparent electrode, such as for example, ITO, IZO, ZnO or $In_2O_3$, can be included on the material layer.

According to the present embodiments, a flat display device can be manufactured by bonding the film 30 on which the conductive pattern 32 is formed, allowing the conductive pattern 32 to serve as the pixel electrode, particularly if the substrate is formed of plastic.

Also, since the conductive pattern 32 acts as a barrier against moisture or oxygen, the air tightness of the device can further be improved.

Figure 9:
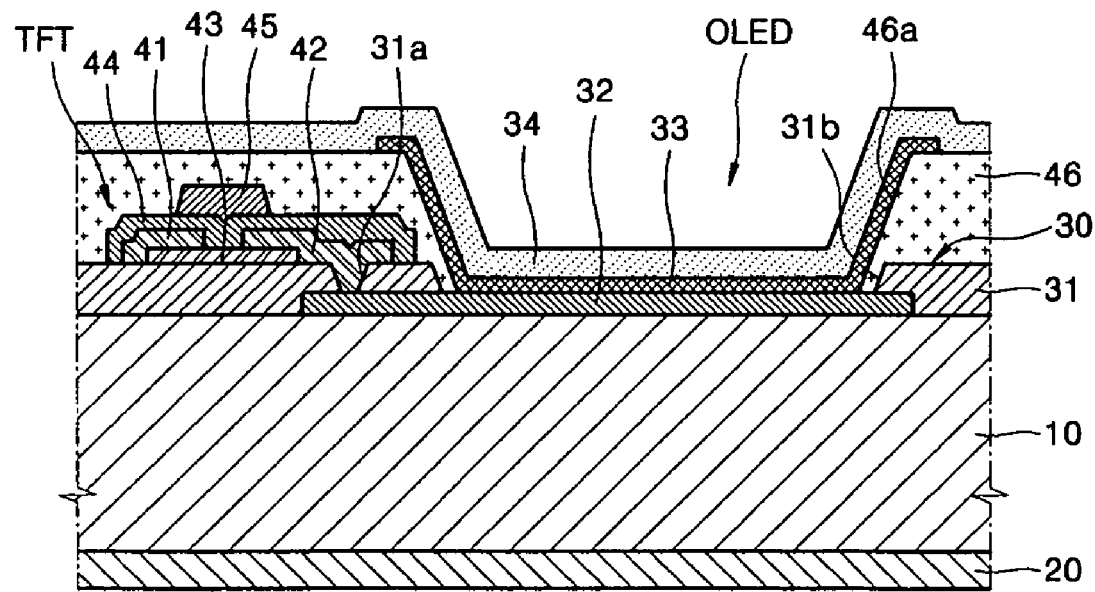
FIG. 9 is a cross-sectional view illustrating an organic light emitting display device manufactured according to another embodiment.

FIG. 9 is a cross-sectional view illustrating a flat display device according to another embodiment. Referring to FIG. 9, after forming a semiconductor layer 43 on a film 30, a source electrode 41 and a drain electrode 42 are formed to contact the semiconductor layer 43. At this time, a first opening 31a is formed on the outside of the semiconductor layer 43 to put the drain electrode 42 in contact with the conductive pattern 32, but the present embodiments are not limited thereto. That is, the drain electrode 42 can be formed after forming the first opening passing through a base 31 and the semiconductor layer 43 on which a film 30 is formed.

The rest of the flat display device in FIG. 9 is identical to that described with reference to FIG. 8. The descriptions thereof will not be repeated.

The structure of the TFT and the light emitting device according to the present embodiments are not limited, and can be varied as needed.

In the aforementioned present embodiments, an active matrix type light emitting display device has been described. However, as described above, the present embodiments can also be applied to any display device having a TFT, such as TFT LCD device.

Also, the TFT formed on a plastic substrate according to the present embodiments can be applied to any device having a flexible TFT, such as an electronic sheet or a smart card, besides the above mentioned display device.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing a substrate having a thin film transistor (TFT), the method comprising:
   preparing a film including a base and a plurality of conductive patterns;
   bonding the film to a substrate;
   forming the TFT on the film in a manner such that it is electrically connected to the conductive pattern of the film; and
   forming an insulating layer covering the TFT on the film.

2. The method of claim 1, wherein the forming of the TFT comprises:
   connecting at least one of source and drain electrodes to the conductive pattern, wherein the source and drain electrodes are formed on the film;
   forming a semiconductor layer contacting each of the source and drain electrodes;
   forming a gate insulating film on the semiconductor layer; and
   forming a gate electrode on the gate insulating film.

3. The method of claim 2, wherein the gate insulating film is patterned to at least a region corresponding to the semiconductor layer.

4. The method of claim 2, wherein the semiconductor layer is formed of an organic material.

5. The method of claim 1, wherein the forming of the TFT comprises: forming a semiconductor layer on the film;
   connecting at least one of the source and drain electrodes to the conductive pattern, wherein the source and drain electrodes are formed on the film;
   forming a gate insulating film on the semiconductor layer and the source and drain electrodes; and
   forming a gate electrode on the gate insulating film.

6. The method of claim 1, wherein at least one of the surfaces of the film does not expose the conductive pattern, and the bonding of the film is performed so that the surface on which the conductive pattern is not exposed faces the outside.

7. The method of claim 1, wherein the substrate is formed of plastic.

8. A substrate having a TFT manufactured according to the method of claim 1.

9. A flat panel display device comprising a substrate having one or more of a TFT manufactured according to the method of claim 1.

10. The method of claim 4, wherein the organic material comprises at least one from the group consisting of pentacene, tetracene, naphthalene, alpha-4-thiophene, alpha-6-thiophene, perylene and its derivatives, rubrene and its derivatives, coronene and its derivatives, perylene tetracarboxylic diimide and its derivatives, perylene tetracarboxylic dianhydride and its derivatives, oligonaphthalene and its derivatives, alpha-5-thiophene oligothiophene and its derivatives, phthalocyanine that does or does not include a metal and its derivatives, pyromelitic dianhydride and its derivatives, and pyromelitic diimide and its derivatives.

11. The method of claim 5, wherein the gate insulating film is patterned to at least a region corresponding to the semiconductor layer.

12. The method of claim 5, wherein the semiconductor layer is formed of an organic material.

13. A flat panel display device comprising the substrate of claim 8.

14. The method of claim 12, wherein the organic material comprises at least one from the group consisting of pentacene, tetracene, naphthalene, alpha-4-thiophene, alpha-6-thiophene, perylene and its derivatives, rubrene and its derivatives, coronene and its derivatives, perylene tetracarboxylic diimide and its derivatives, perylene tetracarboxylic dianhydride and its derivatives, oligonaphthalene and its derivatives, alpha-5-thiophene oligothiophene and its derivatives, phthalocyanine that does or does not include a metal and its derivatives, pyromelitic dianhydride and its derivatives, and pyromelitic diimide and its derivatives.

15. A method of manufacturing a flat panel display device, the method comprising:
   preparing a film including a base and a plurality of conductive patterns;
   bonding the film to a substrate;
   forming a TFT on the film in a manner such that it is electrically connected to the conductive pattern of the film;
   forming an insulating film covering the TFT on the film; and
   forming an opening in the insulating film to expose a region of the conductive pattern.

16. The method of claim 15, wherein the forming of the TFT comprises:
   connecting at least one of source and drain electrodes to the conductive pattern, wherein the source and drain electrodes are formed on the film;
   forming a semiconductor layer contacting each of the source and drain electrodes;
   forming a gate insulating film on the semiconductor layer; and
   forming a gate electrode on the gate insulating film.

17. The method of claim 15, wherein the forming of the TFT comprises:
   connecting at least one of source and drain electrodes to the conductive pattern, wherein the source and drain electrodes are formed on the semiconductor layer;
   forming a gate insulating film on the semiconductor layer and the source and drain electrodes; and
   forming a gate electrode on the gate insulating film.

18. The method of claim 15, wherein at least one of the surfaces of the film does not expose the conductive pattern, and the bonding of the film is performed so that the surface on which the conductive pattern is not exposed faces the outside.

19. The method of claim 15, wherein the substrate is formed of plastic.

20. A flat panel display device manufactured according to the method of claim 15.

21. The method of claim 16, wherein the gate insulating film is patterned to at least a region corresponding to the semiconductor layer.

22. The method of claim 16, wherein the semiconductor layer is formed of an organic material.

23. The method of claim 17, wherein the gate insulating film is patterned to at least a region corresponding to the semiconductor layer.

24. The method of claim 17, wherein the semiconductor layer is formed of an organic material.

25. The method of claim 18, further comprising patterning the film to expose a portion of the conductive pattern before forming the TFT.

26. The method of claim 22, wherein the organic material comprises at least one from the group consisting of pentacene, tetracene, naphthalene, alpha-4-thiophene, alpha-6-thiophene, perylene and its derivatives, rubrene and its derivatives, coronene and its derivatives, perylene tetracarboxylic diimide and its derivatives, perylene tetracarboxylic dianhydride and its derivatives, oligonaphthalene and its derivatives, alpha-5-thiophene oligothiophene and its derivatives, phthalocyanine that does or does not include a metal and its derivatives, pyromelitic dianhydride and its derivatives, and pyromelitic diimide and its derivatives.

27. The method of claim 24, wherein the organic material comprises at least one from the group consisting of pentacene, tetracene, naphthalene, alpha-4-thiophene, alpha-6-thiophene, perylene and its derivatives, rubrene and its derivatives, coronene and its derivatives, perylene tetracarboxylic diimide and its derivatives, perylene tetracarboxylic dianhydride and its derivatives, oligonaphthalene and its derivatives, alpha-5-thiophene oligothiophene and its derivatives, phthalocyanine that does or does not include a metal and its derivatives, pyromelitic dianhydride and its derivatives, and pyromelitic diimide and its derivatives.

* * * * *